United States Patent [19]

Yamamura et al.

[11] Patent Number: 4,794,279
[45] Date of Patent: Dec. 27, 1988

[54] A SOLID STATE IMAGING DEVICE WHICH APPLIES TWO SEPARATE STORAGE VOLTAGES FOR THE SIGNAL CHARGES SO AS TO REDUCE THE SMEAR LEVEL AND THE DARK CURRENT

[75] Inventors: Michio Yamamura, Tokyo; Hiroshi Terakawa, Kanagawa; Tetsuro Kumesawa, Kanagawa; Takashi Fukusyo, Kanagawa, all of Japan

[73] Assignee: Sony Corporation, Tokyo, Japan

[21] Appl. No.: 50,400

[22] Filed: May 18, 1987

[30] Foreign Application Priority Data

May 19, 1986 [JP] Japan .................................. 61-114375

[51] Int. Cl.$^4$ ...................... H03K 3/42; H01L 29/78; H01L 27/14; H04N 3/14
[52] U.S. Cl. ...................................... 307/311; 357/24; 357/30; 377/58; 358/213.16; 358/213.24; 358/213.31
[58] Field of Search ............. 357/24 LR, 30; 307/311; 377/57-63; 358/213.16, 213.24, 213.31

[56] References Cited

U.S. PATENT DOCUMENTS

| 4,143,389 | 3/1979 | Koike et al. | 357/24 L R |
| 4,743,778 | 5/1988 | Takatsu et al. | 307/311 |

FOREIGN PATENT DOCUMENTS

| 61-219271 | 9/1986 | Japan | 357/24 L R |
| 62-21377 | 1/1987 | Japan | 357/24 L R |

Primary Examiner—Gene M. Munson
Attorney, Agent, or Firm—Hill, Van Santen, Steadman & Simpson

[57] ABSTRACT

A solid state imager device having a substrate of a first conductivity type, a charge storage area of a second conductivity type formed on the substrate of the first conductivity type, and a forward electrode formed on the charge storage area of the second conductivity type through an insulating layer, and the forward electrode is alternately supplied with a first voltage for accumulating charges of the first conductivity type on a boundary between the charge storage area of the second conductivity type and the insulating layer and a second voltage so as to extend the depletion layer formed beneath the charge storage area of the second conductivity type.

3 Claims, 2 Drawing Sheets

A SOLID STATE IMAGING DEVICE WHICH APPLIES TWO SEPARATE STORAGE VOLTAGES FOR THE SIGNAL CHARGES SO AS TO REDUCE THE SMEAR LEVEL AND THE DARK CURRENT

BACKGROUND OF THE INVENTION

1. Field of the Invention

This invention relates generally to a solid state imager device and is directed more particularly to an interline transfer type solid state imager device which has a light receiving section formed of a buried channel MOS structure.

2. Description of the Prior Art

In a solid state imager device due to its characteristics, it is desirable to reduce, as much as possible the dark current which may be a source of noise.

A conventional solid state imager device which can reduce the dark current, for example, is disclosed in a collection of papers presented at '84 National Conference of the Institute of Television Engineers of Japan, on pages 41–42. Such known solid state imager device has a light receiving section which is formed of a buried channel MOS structure. Specifically, the device is constructed such that an n-type charge storage area is formed over the surface of a p-type silicon substrate and a forward electrode is formed on the charge storage area through an insulating layer, so that it can be operated under conditions where a hole storage layer is produced on a boundary between the n-type charge storage area and the insulating layer. In this solid state imager device, the forward electrode is applied with a predetermined direct current voltage so as to form a channel within the n-type charge storage area from holes previously stored on the surface of the n-type charge storage area. Thus, the holes are kept in a so-called pinning state, so as to suppress the generation of hole-electron pairs which are the main component of the dark current from the surface level. A solid state imager device as described above can advantageously reduce the dark current.

However, such conventional solid state imager device has disadvantages in that since the forward electrode is always supplied with a direct current voltage so as to store holes on the boundary between the n-type charge storage area and the insulating layer, the depletion layer under the charge storage area is not extended making it impossible to suppress disturbances in images which are picked-up, which disturbances are caused by signal charges flowing from the inside of the substrate into the charge transfer section, which are called "smear".

OBJECTS AND SUMMARY OF THE INVENTION

Accordingly, it is an object of the present invention to provide a solid state imager device which can effectively suppress dark current as well as smear.

To achieve the above object, the present invention provides a solid state imager device comprising;

(a) a substrate of a first conductivity type;

(b) a charge storage area of a second conductivity type formed on a surface of the substrate of the first conductivity type;

(c) a forward electrode formed on the charge storage area of the second conductivity type through an insulating layer; and (d) a means for alternatively supplying the forward electrode with a first voltage for accumulating charges of a first conductivity type on a boundary between the charge storage area of the second conductivity type and the insulating layer and a second voltage for extending a depletion layer formed beneath the charge storage area of the second conductivity type.

These and other objects, features and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENT

An embodiment of a solid state imager device according to the present invention will be described with reference to FIGS. 1–3.

Figure 1:
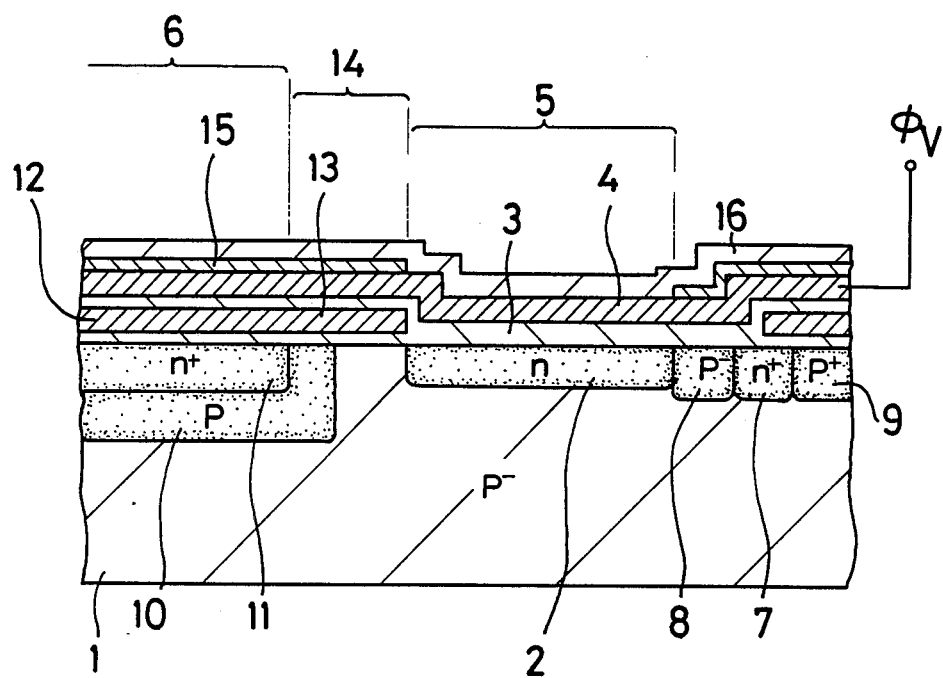
FIG. 1 is a diagram showing a cross-sectional view of a main portion of a solid state imager device according to the present invention.

FIG. 1 shows a p-type silicon substrate 1 into which a p-type impurity is diffused with a relatively low concentration. It is assumed in the present embodiment that a light receiving section 5, a vertical register section 6, a horizontal register section (not shown) and an output circuit section (not shown) are all formed on the p-type silicon substrate 1. In the structure, a plurality of the light receiving sections 5 are provided which are arranged in the horizontal and vertical directions. The vertical register section 6 is arranged to be parallel to each of the vertically aligned light receiving sections 5, and the vertical register section 6 is arranged to be parallel to the horizontal register section, so as to form an interline transfer solid state imager device.

The light receiving section 5 comprises an n-type charge storage area 2 on the surface of the p-type silicon substrate 1. A forward electrode 4 is formed of a light transmissible polysilicon which is deposited over the charge storage area 2 through an insulating layer 3 made of $SiO_2$, so that the light receiving section 5 is formed by the buried channel MOS structure.

Figure 2A:
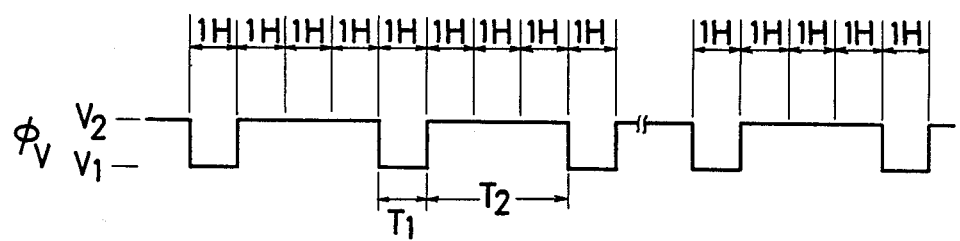
FIGS. 2A and 2B are timing charts showing waveforms of a pulse signal $\phi v$ and a dark signal, respectively.

When the solid state imager device of the present embodiment is operated so as to pick up an image, the forward electrode 4 is supplied through terminal B with a pulse signal $\phi v$, as shown in FIG. 2A. When the forward electrode 4 is supplied with a low level voltage $V_1$, e.g. $-12$ V, a storage layer of holes is formed on the boundary between the charge storage area 2 and the insulating layer 3, and when a high level voltage $V_2$, e.g. 2 V is supplied, the depletion layer beneath the charge storage area 2 is extended in the thickness direction of the substrate 1. It should be noted that the pulse signal $\phi v$ is selected such that its rising-up edge and its falling-down edge are within a horizontal blanking period so that the image signal is not influenced by the pulse signal $\phi v$.

Also, a relatively high concentration n-type overflow drain region 7 is formed adjacent to the charge storage area 2 through p-type overflow control region 8 so as to prevent so-called blooming where the image picked up is made unclear by excessive signal charges which are produced when an especially strong light is incident on the imager device, and which flow into other charge storage areas. A p-type channel stopper region 9 is arranged adjacent to the overflow drain region 7 as well as in regions between respective charge storage areas which are vertically adjacent to each other.

The vertical register section 6 is formed of an n-type charge transfer region 11 formed on a p-type well region 10 which is selectively formed on the p-type silicon substrate 1 and a transfer electrode 12 made of polysilicon is formed on the charge transfer region 11 through the insulating layer 3. Thus, the vertical register section 6 is formed as a so-called bulk charge coupled device (BCCD) structure. FIG. 1 shows only one transfer electrode 12. However, as is well known in the art, the required number of transfer electrodes 12 are provided so that the vertical register section 6 of the present embodiment is driven in a 4-phase driving manner.

On the insulating layer 3 between the light receiving section 5 and the vertical register section 6, there is formed a gate electrode 13 for controlling the transfer of signal charges which accumulate in the charge storage area 2 to the charge transfer region 11 in a manner such that it is integral with a portion of the transfer electrode 12, to thus form a gate section 14. The signal charges are transferred from the charge storage area 2 to the charge transfer region 11 during a vertical flyback period using a low level voltage $V_1$ which is supplied to the forward electrode 4.

On the upper surface of the forward electrode 4 except over the light receiving section 5 there is deposited a light shielding layer 15 made e.g. of Al. Also, over all of the forward electrode 4 there is deposited a protective layer 16 made of $SiO_2$.

Other sections required for the interline transfer solid state imager device, such as the horizontal register section, the output circuit section are formed in the same manner as the conventionally known device, and these are not shown in FIG. 1.

Figure 2B:

In the solid state imager device of the present invention constructed as described above, the forward electrode 4 is supplied with the pulse signal $\phi v$ as shown in FIG. 2A. When the forward electrode 4 is supplied with the low level voltage $V_1$, holes will accumulate on the surface of the charge storage area 2 and the the holes are kept in the pinning state, to suppress hole-electron pair generation from the surface level. If the forward electrode 4 is supplied with the high level voltage $V_2$, the holes which have accumulated on the surface of the charge storage area 2 will be released. However, once the holes accumulate on the surface of the charge storage area 2, the hole-electron pair generation is suppressed for a predetermined time during which the holes are released. Therefore, if the pulse signal $\phi v$ shown in FIG. 2A is applied to the forward electrode 4, a dark signal such as shown in FIG. 2B will be generated in the charge storage area 2. If the duty ratio $T_2/T_1$ of the pulse voltage $\phi v$ is varied from $T_2/T_1=0$ to $T_2/T_1=10$, the dark current output will increase as indicated by the solid line curve X in FIG. 3. Specifically, the dark current output will be low when the duty ratio $T_2/T_1$ is smaller, and the dark current output goes higher when the duty ratio $T_2/T_1$ becomes larger.

When the low level voltage $V_1$ is supplied to the forward electrode 4, the depletion layer formed beneath the charge storage area 2 becomes shallow, which allows smear to be easily produced. On the other hand, when the high level voltage $V_2$ is supplied to the forward electrode 4, the depletion layer formed beneath the charge storage area 2 becomes thicker, which suppresses the generation of smear. The solid line curve y in FIG. 3 shows how the smear level is varied when the duty ratio $T_2/T_1$ of the pulse voltage $\phi v$ is varied from $T_2/T_1=0$ to $T_2/T_1=10$. In FIG. 3, a smear level value when the duty ratio $T_2/T_1$ is 0 is defined as 1, and the curve illustrates variations in the smear level value as this ratio is varied.

Figure 3:
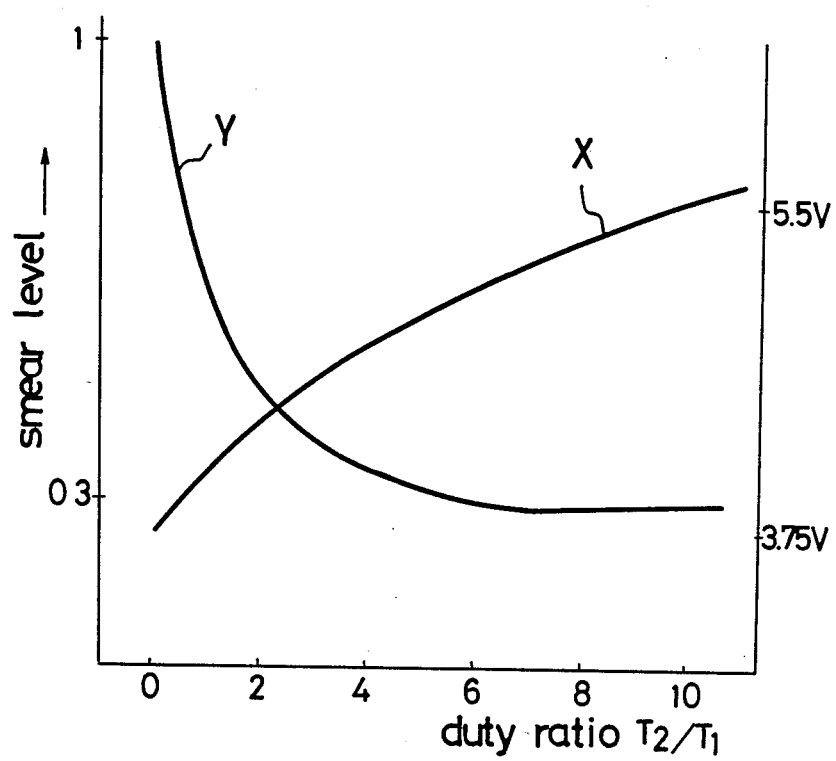
FIG. 3 is a graph showing the relationship between the duty ratio $T_2/T_1$ of the pulse signal $\phi v$ and a smear level and a relationship between the duty ratio $T_2/T_1$ and a dark signal output.

As will be understood from a consideration of FIG. 3, it is possible to reduce the dark current as well as the smear level by selecting the duty ratio $T_2/T_1$ of the pulse signal $\phi v$ to fall in a range of $T_2/T_1=2$ to $T_2/T_1=5$.

As described above, the present embodiment has advantages over the prior art in that the dark current and smear level can be effectively reduced by using a simple construction such that the forward electrode 4 is alternately supplied with the pulse signal $\phi v$ consisting of a low level voltage $V_1$, e.g. $-12$ V, for accumulating holes on the surface of the charge storage area 2 and a high level voltage $V_2$, e.g. 2 V, for extending the depletion layer beneath the charge storage area 2 and by using an appropriate duty ratio in the range of 2–5.

A further advantage of the present embodiment is that the dark current from the surface level 8 is not completely suppressed but is produced in a degree such that the quality of the image is not influenced by the dark current which makes it difficult to distinguish minute local dark signals (white flaw), produced by crystal defects and the like and other factors than the surface level, which appear on an image if the dark current is completely suppressed.

Figure 4:
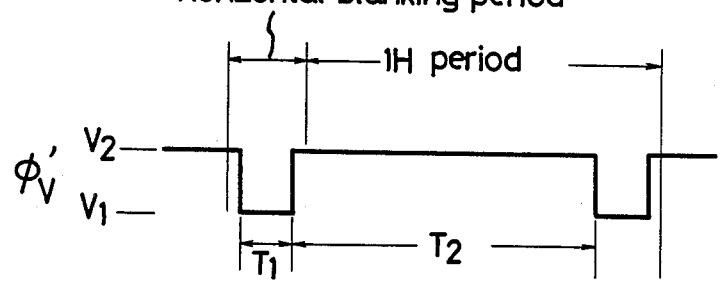
FIG. 4 is a chart showing a waveform of a pulse signal $\phi v'$.

The above described embodiment is for a case where the low level voltage period $T_1$ is determined as one horizontal period and the pulse signal $\phi v$ raises and falls within the horizontal blanking period. Alternatively, a pulse signal $\phi v'$ which has its low level voltage arranged within the horizontal blanking period, as shown in FIG. 4, may be applied to the forward electrode. In this case, the duty ratio $T_2/T_1$ can be set to have a sufficiently large value so that smear can be satisfactorily suppressed, and so that the surface is not depleted continuously for more than one horizontal period so that the dark current can also be sufficiently suppressed.

The above described present embodiment is for the case where the signal charges are electrons. However, the present invention may be applied to a case where the signal charges are holes. For that case, the conductivity types of the respective sections are selected so as to opposite to those shown in FIG. 1. The same effects as described above can be obtained in this case.

The above description is for a single preferred embodiment of the invention but it will be apparent that many modifications and variations could be effected by one skilled in the art without departing from the spirit or scope of the novel concepts of the invention and the scope of the invention should be determined only by the appended claims.

We claim as our invention:

1. A solid state imager device which operates with various timings including horizontal blanking periods, comprising:
   (a) a substrate of a first conductivity type;
   (b) a charge storage area of a second conductivity type formed on a surface of said substrate of the first conductivity type;
   (c) a forward electrode formed on said charge storage area of the second conductivity type which extends through an insulating layer; and
   (d) a means for alternatively supplying said forward electrode with a first voltage for accumulating minority carriers in said charge storage area on a boundary between said charge storage area of the second conductivity type and said insulating layer and a second voltage for extending the depletion layer formed beneath said charge storage area of the second conductivity type and wherein said first and second voltages are applied during signal charge accumulation.

2. A solid state imager device as claimed in claim 1, wherein the time duty ratio $T_2$ to $T_1$ of said second voltage to said first voltage is selected to be in a range of from about 2 to 5 where $T_2$ is the time during each cycle that said second voltage is applied and $T_1$ is the time during each cycle that said first voltage is applied.

3. A solid state imager device as claimed in claim 1, wherein said first voltage is applied within one of said horizontal blanking periods.

* * * * *